United States Patent [19]
Hohimer et al.

[11] Patent Number: 5,398,256
[45] Date of Patent: Mar. 14, 1995

[54] INTERFEROMETRIC RING LASERS AND OPTICAL DEVICES

[75] Inventors: John P. Hohimer; David C. Craft, both of Albuquerque, N. Mex.

[73] Assignee: The United States of America as represented by the United States Department of Energy, Washington, D.C.

[21] Appl. No.: 61,400

[22] Filed: May 10, 1993

[51] Int. Cl.⁶ .............................................. H01S 3/083
[52] U.S. Cl. ........................................ 372/94; 372/46; 372/50
[58] Field of Search ................. 372/94, 45, 46, 50

[56] References Cited

U.S. PATENT DOCUMENTS

| | | |
|---|---|---|
| 4,112,389 | 9/1978 | Streifer et al. .................... 372/50 |
| 4,405,236 | 9/1983 | Mitsuhashi et al. ................ 356/350 |
| 4,521,110 | 6/1985 | Roberts et al. ..................... 356/350 |
| 4,792,962 | 12/1988 | Miyauchi et al. ................... 372/94 |
| 4,905,252 | 2/1990 | Goldberg et al. ................... 372/94 |
| 5,022,760 | 6/1991 | Lawrence et al. .................. 372/94 |
| 5,031,190 | 7/1991 | Behfar-Rad ......................... 372/94 |

Primary Examiner—James W. Davie
Attorney, Agent, or Firm—Gregory A. Cone

[57] ABSTRACT

Two ring diode lasers are optically coupled together to produce tunable, stable output through a Y-junction output coupler which may also be a laser diode or can be an active waveguide. These devices demonstrate a sharp peak in light output with an excellent side-mode-rejection ratio. The rings can also be made of passive or active waveguide material. With additional rings the device is a tunable optical multiplexer/demultiplexer.

18 Claims, 7 Drawing Sheets

INTERFEROMETRIC RING LASERS AND OPTICAL DEVICES

The government has rights to this invention pursuant to Contract No. DE-AC04-76DP00789 awarded by the U.S. Department of Energy.

BACKGROUND OF THE INVENTION

This invention relates to optical ring resonators. More particularly this invention relates to interferometric ring lasers with multiple ring cavities that are optically coupled together.

Semiconductor diode lasers with a ring resonator are an alternative to linear-cavity (Fabry-Perot) lasers for photonic integrated circuits and other applications. A ring resonator utilizes total internal reflection in a circular or other shaped ring structure, eliminating the need for end-facet mirrors and simplifying integration with waveguides, detectors, and other photonic integrated circuit components.

Current diode laser sources for photonic integrated circuits are primarily of the distributed feedback and distributed Bragg reflector types, requiring complicated device processing (etching of submicron diffraction gratings followed by regrowth of semiconductor cladding layers). Alternative diode laser sources (e.g. cleaved-coupled-cavity lasers) cannot be coupled to photonic integrated circuits without air-gap coupling which causes interference effects and undesirable feedback.

A new type of diode laser source, the ring resonator laser disclosed herein, is well-suited to photonic integrated circuits. This laser uses total internal reflection in a ring structure without end-facet mirrors so that it can be direct-coupled to waveguides and other photonic integrated circuit components. Previously, we have designed and fabricated single-quantum-well circular branching-waveguide Y-junction ring lasers to operate CW (J. P. Hohimer, D. C. Craft, G. R. Hadley, G. A. Vawter, and M. E. Warren, "Single-Frequency Continuous-Wave Operation of Ring Resonator Diode Lasers", Appl. Phys. Lett. 59, 3360 (1991)). These lasers were the first circular rib-waveguide Y-junction ring lasers to operate in a continuous wave (CW) mode. We also reported the first measurements of the size dependence of the lasing threshold current density in these devices (J. P. Hohimer, D. C. Craft, G. R. Hadley, and G. A. Vawter, "CW Room-Temperature Operation of Y-Junction Semiconductor Ring Lasers", Electron. Lett. 28, 374 (1992)). Our lowest CW threshold current for these devices was 40 mA (530 A/cm$^2$), with single-frequency operation (>20 dB side-mode suppression) and about 1 mW of TE-polarized output. We were also the first to report the deleterious effect that the outcoupling Y-junction can have in limiting the output power in these lasers by controlling the lasing ring modes.

SUMMARY OF THE INVENTION

The interferometric ring diode laser of this invention has improved output power and side-mode suppression, and a new mode of operation characterized by a sharp on and off spike in the lasing output which occurs over a small range in operating current. This interferometric ring diode laser has a dual circular ring structure with one ring resonator located within the cavity of a second ring and direct-coupled to it by means of branching-waveguide Y-junctions. The coupled ring cavities act to control the lasing wavelength and mode, resulting in a single-frequency output with an increased side-mode-rejection (SMR) ratio. The coupled cavities also control the interaction of the lasing mode with the Y-junction output coupler, resulting in a variable (current-dependent) outcoupling of the lasing light. This produces a sharp peak in the light-vs-current (L-I) curves for these devices which is not observed with single-ring diode lasers and other conventional diode lasers. At the peak of the lasing output, the devices have emitted 8 mW of single-frequency output with an SMR ratio of 30 dB. This apparatus can also be implemented as a passive optical waveguide with external optical inputs or as an active optical waveguide with gain. The invention further includes ring devices with three or more rings which are useful as tunable multiplexing/demultiplexing devices.

DETAILED DESCRIPTION OF THE INVENTION

Although initially embodied herein as multiple ring-cavities of laser diodes, it should be realized that the effects demonstrated herein are not so limited. The underlying concepts are that the coherent light trains circulating in either direction in the separate but optically coupled ring cavities will beat against each other depending upon the lengths of the different cavities and the photon densities in the cavities. Since the output is coupled out of the cavities at a fixed location on a ring cavity, the interference effect will determine how mode(s) will interact with the coupling region to the output leg of the device and be output therefrom. When properly tuned, the device can produce a sharp output power spike for a relatively narrow range of injected current/photon density levels. It can also produce a stable output wavelength for a relatively broad range of injected current/photon density levels. Such a device can function in a variety of ways including, but not limited to, a source of single wavelength light for optical systems, a tunable means to discriminate between different frequencies as a filter or multiplexer/demultiplexer, and an optical logic element.

Figure 1:
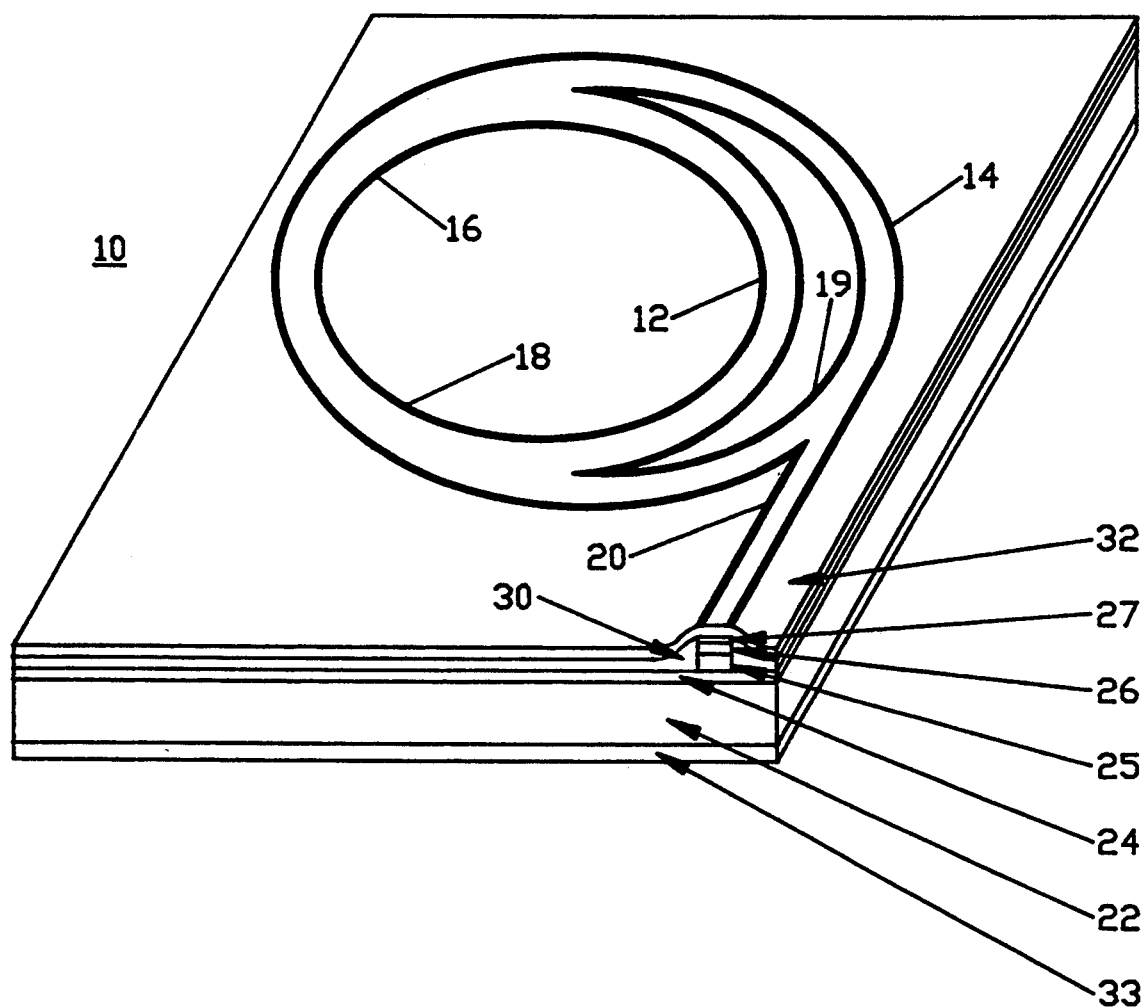
FIG. 1 is an isometric view showing the configuration of the ring cavities and the layers of the apparatus.

FIG. 1 shows a schematic drawing of the interferometric ring diode laser. The interferometric ring structure 10 consists of an inner 137.5-micron-radius circular waveguide ring 12 and an outer 150 micron-radius ring 14, both of the same waveguide width (4,6, or 8 microns) and direct-coupled by means of the Y-junction branching waveguides 16 and 18 formed by the intersection of the two ring waveguides. The lengths of the two ring cavities were made nearly equal (11:12) ratio to reduce the bending loss in the inner ring and to provide a relatively large wavelength spacing (2.66 nm) for the coupled-cavity resonances. A separate Y-junction 19 located on the outer ring is used to couple out a portion of the lasing light to an actively-pumped equal-width waveguide 20 terminated by an uncoated cleaved facet. Alternately, the output waveguide can be direct-coupled to other waveguides in the form of a photonic integrated circuit. Although the dimensions and configuration of this prototype interferometric ring laser are as stated above, other dimensions and configurations would work equally well and may be used for future devices. Some of these embodiments of the invention are shown in FIG. 4.

The semiconductor ring laser wafer is grown by conventionally known methods. A preferred method for growing a single-quantum-well graded-index separate-confinement-heterostructure (GRIN-SCH) for the interferometric ring laser is by metal-organic chemical vapor deposition (MOCVD) on a (100)-oriented, Si-doped ($1 \times 10^{18}$cm$^{-3}$) n-type GaAs substrate 22. In this method, a 1.0-$\mu$m GaAs:Se ($1 \times 10^{18}$cm$^{-3}$) n-type buffer layer is initially grown followed by a 1.5-$\mu$m Al$_{0.60}$Ga$_{0.40}$As:Se ($5 \times 10^{17}$cm$^{-3}$) n-type optical confinement (cladding) layer, both shown as 24; an undoped active region 25 consisting of a 0.2-$\mu$m Al$_x$Ga$_{1-x}$As linearly graded (x=0.6–0.3) layer, a single 100 angstrom GaAs quantum well, and a 0.2-$\mu$m Al$_x$Ga$_{1-x}$As linearly graded (x=0.3–0.6) layer; a 1.5-$\mu$m Al$_{0.60}$Ga$_{0.40}$As:Zn ($8 \times 10^{17}$cm$^{-3}$) p-type optical confinement (cladding) layer 26 and a 0.1-$\mu$m GaAs:Zn ($1 \times 10^{19}$cm$^{-3}$) p-type surface cap layer, 27. Other epitaxial growth techniques including molecular beam epitaxy (MBE) and liquid phase epitaxy (LPE), as well as other material systems and other epitaxial layer structures are applicable to the present invention. This invention is also applicable to the fabrication of lasing and non-lasing interferometric waveguide structures formed by other layer deposition techniques using both semiconductor and non-semiconductor materials.

After growth, a hard-baked photoresist pattern was used as an etch mask to form the rib-waveguide ring structure in the epitaxially grown p-type layers; and the patterned wafer was etched to a depth near or through the active layer ($\geq$1.6 micron depth) by chlorine reactive ion beam etching. (For larger radii devices, the curved waveguide bend loss is reduced so that the etch depth can be reduced to penetrate only the region of the upper cladding layer.) After the etch step, a full-surface polyimide insulating layer 30 was spun on, cured, and plasma etched to expose the surface cap layer of the rib waveguides for electrical contact. A patterned Ti/Au electrical contact metallization 32 was applied to the exposed p-type rib-waveguide surface of the wafer. The wafer was then mechanically polished to a thickness of about 100 $\mu$m; and a Au/Ge/Ni full-surface electrical contact metallization 33 was applied to the bottom of the n-type substrate and alloyed.

Other methods well-known to the art can be used to form the waveguides in these interferometric ring lasers including diffusion disordering or ion-implantation disordering of the active layer(s), or by other methods known to those skilled in the art. This selective layer disordering will result in a lateral refractive index discontinuity which will define the ring waveguides. For disordering, a multi-quantum-well active region is preferred to produce a larger refractive index discontinuity (step) and thereby reduce the bend loss in the curved waveguides (since the bend loss in curved waveguides depends exponentially on the refractive index step).

The completed devices were probe tested junction-up (i.e. p-side up) on a temperature-controlled (20°-40° C.) Ag heat sink at currents up to 250 mA. Other devices were soldered junction-up on a Au-plated Cu heat sink for more efficient heat removal and higher current operation.

Figure 2A:
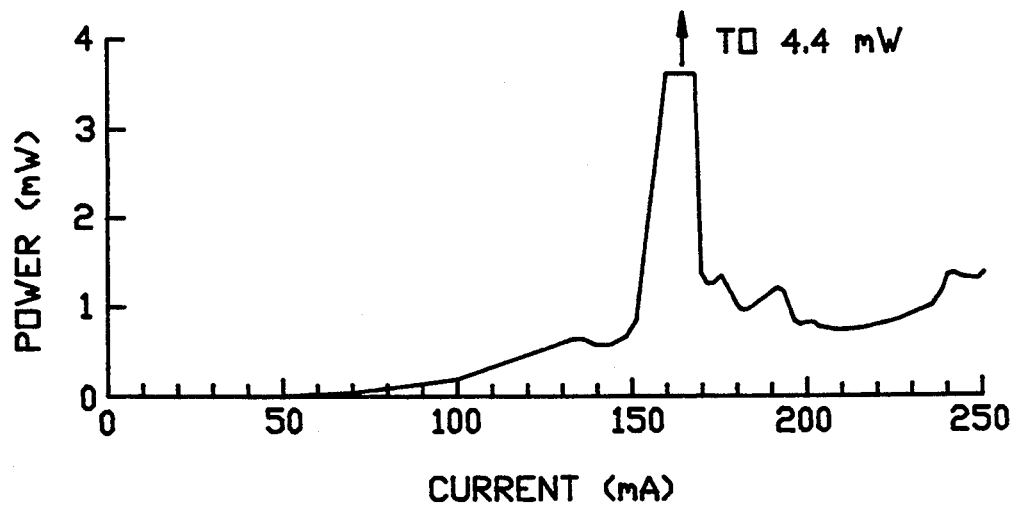
FIGS. 2a, 2b, and 2c are graphs showing optical power output as a function of injected current for three different devices.

FIG. 2a shows the CW light-vs-current curve (at 22° C.) measured for one of these interferometric ring lasers (device #1 with 8 $\mu$m waveguide width) with a threshold current of 69 mA. Above threshold, the lasing output power increases slowly with current to about 1 mW at 150 mA current. Above this current, the output power increases at a very rapidly increasing rate, reaching a peak output power of 4.4 mW. As the current is further increased, the output is relatively constant until it suddenly drops at 172 mA current. With increasing current, the output power is again relatively low up to 250 mA current. This low output power (about 1 mW) is characteristic of single-ring lasers which were fabricated alongside the interferometric ring lasers. The effect of the additional (inner) ring cavity is to dramatically increase the outcoupled laser power at the position of the spike in FIG. 2a over similar single-output ring diode lasers, and to completely alter the behavior of the L-I characteristics.

Figure 2B:
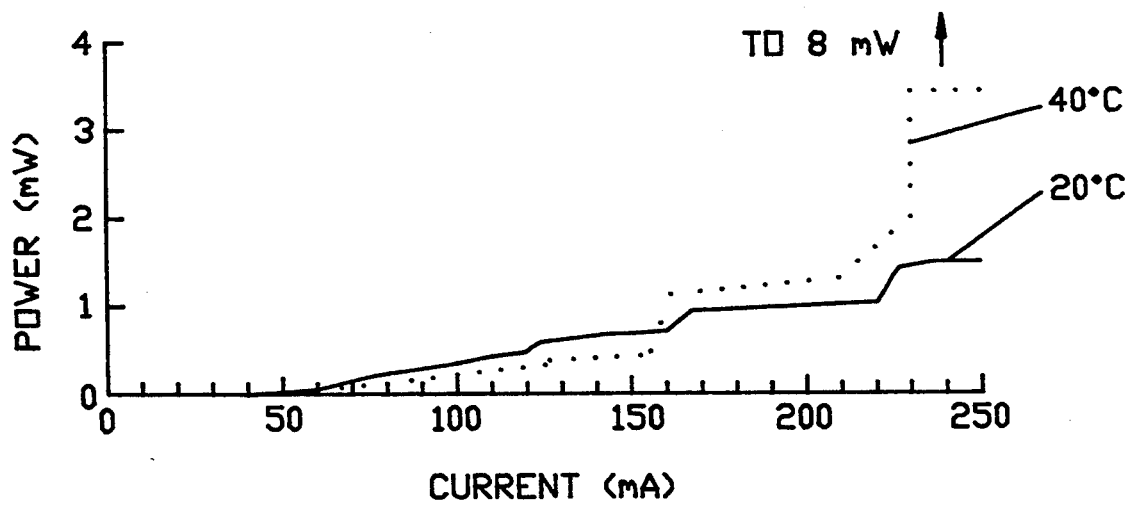

FIG. 2b shows the CW L-I curves at 20° and 40° C. for a second interferometric ring laser (device #2 with a 6 $\mu$m waveguide width). The 20° C. L-I curve shows step-like increases in the lasing output power with increasing current. This step-like behavior is also unique to these interferometric ring lasers and does not occur in single-output ring diode lasers. Increasing the device temperature to 40° C. shifts the steps to lower current (the step at a current of 223 mA at 20° C. is shifted to 155 mA at 40° C.) revealing the sharp spike in the output power at 230 mA current (the reduction in output power at the high-current side of the spike is not shown here due to the limited current range). The peak output power of this device is 8 mW at 240 mA current. This is a five-fold increase in output power as compared to single-output ring diode lasers.

Figure 2C:
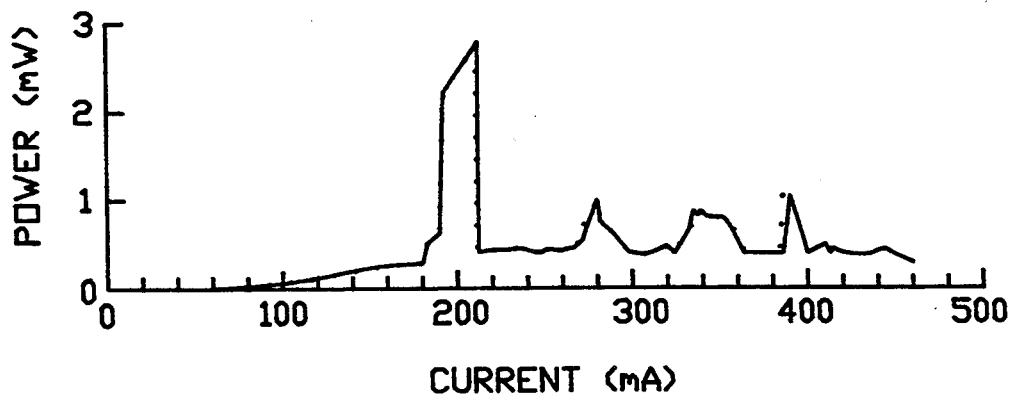

FIG. 2c shows the CW L-I curve at 20° C. for a third interferometric ring laser (device #3 with a 4 $\mu$m waveguide width). This L-I curve shows a sharply peaked output at 210 mA current with several weaker secondary peaks at higher currents. The solid curve is the L-I behavior for increasing current. As the current in this device is reduced (dashed curve in FIG. 2c), the spikes in the lasing output are reproduced with minor changes (due to device heating). The peak output power of this device is also increased five-fold over similar single-output ring diode lasers with the same outcoupling geometry.

The spiked output behavior in FIGS. 2a-c is characteristic of these interferometric ring lasers and is distinct from single-output ring diode lasers and conventional diode lasers in which the output slope efficiency (output power per unit current) is relatively constant above threshold. The width in the output spike in these interferometric ring lasers varies from about 10 to 30 mA; and both the width and current position of the spike depend on temperature.

The spiked output behavior in these interferometric ring diode lasers is due to the interaction between the coupled ring cavities which control the lasing wavelength and mode, and the Y-junction output coupler which we have shown to have a mode-dependent outcoupling and which in single-ring devices influences the lasing mode, limiting the outcoupling loss. As the position and wavelength of the lasing mode are determined and shifted from one coupled-cavity resonance to the next at a longer wavelength, the interaction of the lasing mode at the outcoupling Y-junction is altered and the fraction of the outcoupled light increases. This results in an ever-increasing outcoupling fraction, culminating in the sharp spike in the L-I curve. When the outcoupling loss becomes sufficiently large, the ring lasing shifts to another cavity mode with lower outcoupling loss; and the output drops sharply. The above picture can be readily visualized for "whispering gallery" modes which reflect off the outer boundary of the ring. For such modes, the position of the reflection point relative to the Y-junction output coupler will affect the fraction of light coupled out of the device. The shift in the resonance of the L-I curve to lower current with increased device temperature also supports this theory that the output coupling depends on the position of the lasing mode with respect to the Y-junction output coupler and the resultant interaction.

Figure 3A:
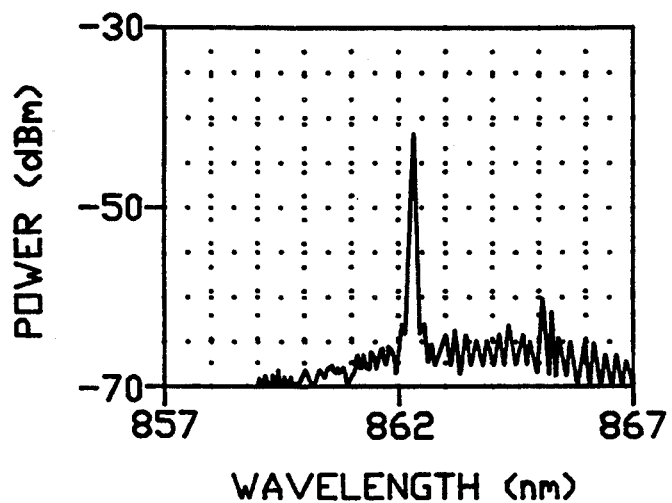
FIGS. 3a and 3b show optical power output as a function of wavelength for one device at two different current levels.

The CW emission spectra of the interferometric ring diode lasers were measured at regular current intervals to determine the level of single-frequency performance. In FIG. 3a, the emission spectrum (22° C.) is shown for device #1 at 80 mA current ($1.16 \times I_{threshold}$). This spectrum was measured with an optical spectrum analyzer (Anritzu, Model MS9001B1) with a lensed input fiber (50 μm core diameter) and 0.2 nm spectral resolution. In FIG. 3a, the lasing output from the interferometric ring laser is single-frequency with the side modes reduced by 18 dB. The quantum-well active region in these devices results in a TE-polarized output.

FIG. 3a also shows the modulation of the spectrum due to coupling between the two ring cavities. The envelope for this modulation has a periodicity given by:

$$\Delta\lambda = \lambda^2/2\pi n(R_2-R_1)$$

where λ is the wavelength, n is the refractive index, and $R_1$ and $R_2$ are the radii of the inner and outer rings respectively. For our devices, the calculated periodicity is 2.66 nm, in agreement with FIG. 3a. Using the above equation, interferometric ring lasers can be designed with different radii to result in a larger or smaller spectral modulation envelope as will become evident to those skilled in the art (for example, the modulation envelope can be designed to match the gain bandwidth of the semiconductor laser structure for improved single-frequency performance).

Figure 3B:
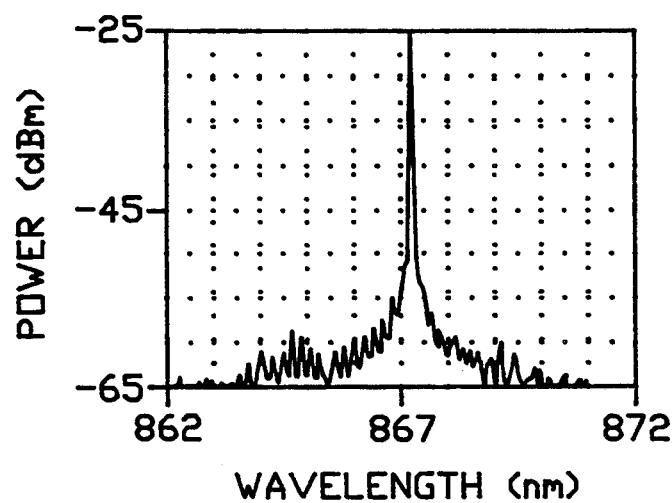
Figure 3C:
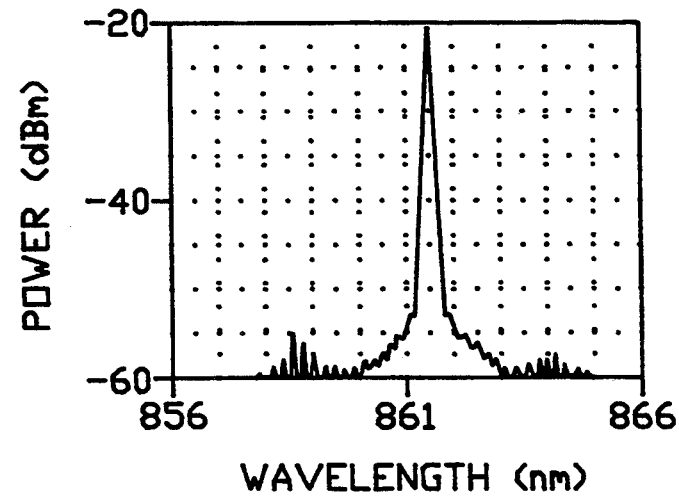
FIG. 3c shows the same variable for a second device.

FIG. 3b shows the emission spectrum (22° C.) for device #1 at 160 mA current ($2.32 \times I_{threshold}$) where the output spike in FIG. 2a occurs. This spectrum shows the single-frequency output power to be increased by a factor of 50 (17 dB) and the side-mode rejection ratio increased to 27 dB. FIG. 3c shows the emission spectrum (at 40° C.) for device #2 at the output spike (235 L-I measurement); and the side modes are reduced by nearly 30 dB.

The performance of these interferometric ring lasers is greatly improved from previous single-ring devices both in the output power level (a five-fold increase) and also in the single-frequency performance (higher side-mode rejection ratio). In addition, the unique operating behavior of these devices will improve their performance for a number of types of applications. For example, the spike in the output can be used with feedback control to the current to the device to stabilize the operating point (output power level, wavelength, and point of high side-mode rejection) of these interferometric ring lasers.

The spike in output power can also be used to advantage for applications requiring modulation of the lasing output. Here, the very high slope efficiency (Watts/Amp) will allow a large increase in the modulated output signal with only a small change in the input signal. Modulation of the device with the bias point set near the sharp decrease in output power at the high-current side of the output spike will result in a phase reversal of the modulated signal.

The spiked behavior of these devices can also be used for complimentary logic applications with the device biased at a current just below the spike in the lasing output. Here, the addition of a small current to the device (a logic "0" level) will result in a large increase in the output power (a logic "1" level). A much larger input current (a logic "1" level) will transition the laser to the low output state (logic "0" level). Other logic applications and schemes will become evident to those skilled in the art.

Figure 4A:
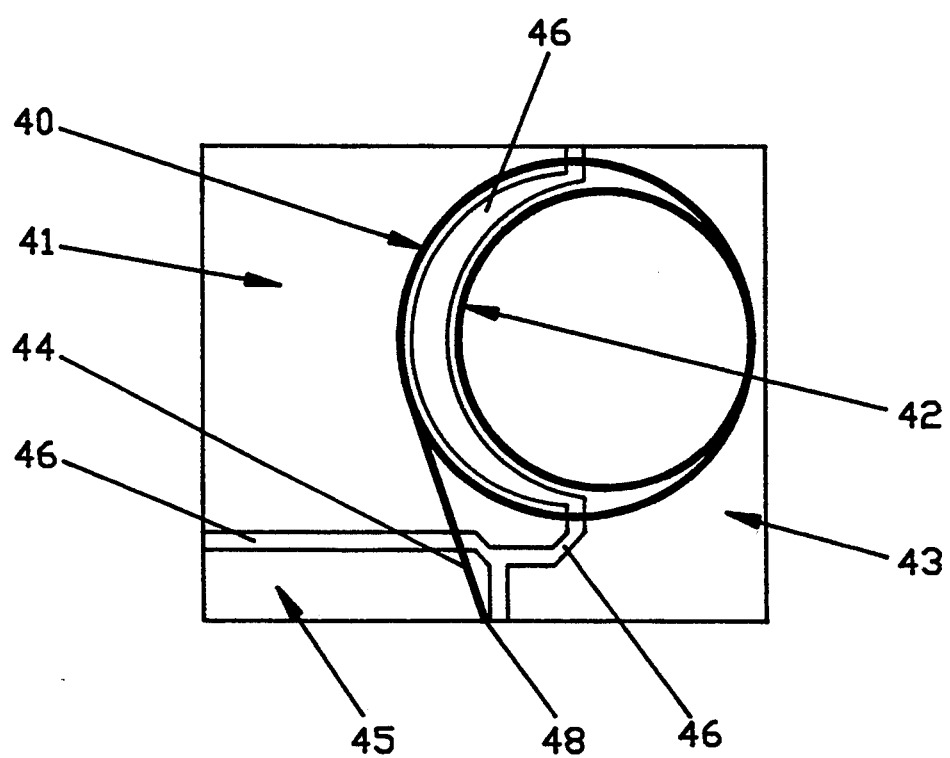
FIGS. 4a, 4b, and 4c show in plan view additional embodiments of two ring cavity devices with separate top electrode metallizations for the three active areas.

FIG. 4 shows several additional embodiments of the present invention which we envision. In FIG. 4a, for embodiment #1 the device of FIG. 1 is equipped with separate contacts 41, 43 and 45 to the inner and outer rings 40 and 42 and also for the output waveguide 44, respectively. Electrical isolation between the separately-contacted sections of the devices is provided by breaks 46 in the contact metallization (for example, a 20 μm gap will result in about 2.4 k Ω of electrical isolation in the present structure). Increased electrical isolation between the separately-contacted sections of these devices can also be realized by etching away the highly-doped surface cap layer in the region of the metallization break, ion-implanting this region to increase its electrical resistance, or by other means commonly employed by those skilled in the art to increase the resistivity of semiconductor materials. The ability to independently control the electrical current to the two rings in this device will allow the lasing mode and wavelength in the device to be continuously tuned with current. This will allow continuous scanning of the lasing wavelength over a wide range and at a high rate (nm/Amp) in a manner similar to cleaved-coupled-cavity lasers, and will also allow feedback-control and stabilization of the lasing wavelength. This will have advantages for a number of applications including wavelength division multiplexing which will become evident to those skilled in the art. In addition, this independent current control will allow independent tuning of the inner ring cavity which will affect the behavior of the output spike in the L-I curves. This will allow the electrical current position and width of the output spike to be controlled and varied. This will enhance the performance of the device and reduce the input current required for the modulation and logic applications discussed above.

The output waveguide in all the embodiments in FIG. 4 has been tilted by an angle of 10° with respect to the cleaved end-facet termination 48 of the output waveguide to reduce reflection feedback into the ring. We have recently shown that this will improve device output power and behavior of single-output rings. This waveguide tilt is advantageous for devices which are not otherwise incorporated into a photonic integrated circuit since the reflection feedback is greatly reduced.

We also show a separate electrical contact metallization to the output waveguide in FIG. 4a and b, 45 and 50 respectively. This will allow modulation of the output from the interferometric ring diode laser without affecting the lasing behavior in the ring cavities. This separately contacted region can also be used with or without feedback techniques to control the lasing output power level by forward-biasing it to generate gain to amplify the lasing output or reverse-biasing it to generate absorption to reduce the lasing output.

Figure 4B:
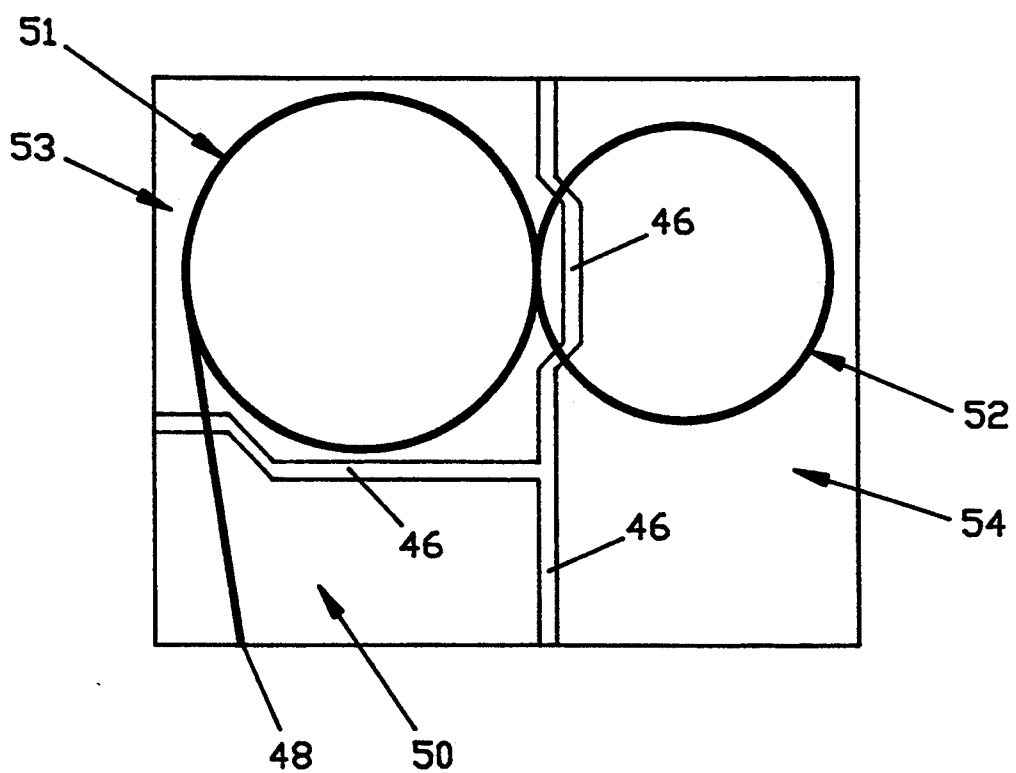
Figure 5:
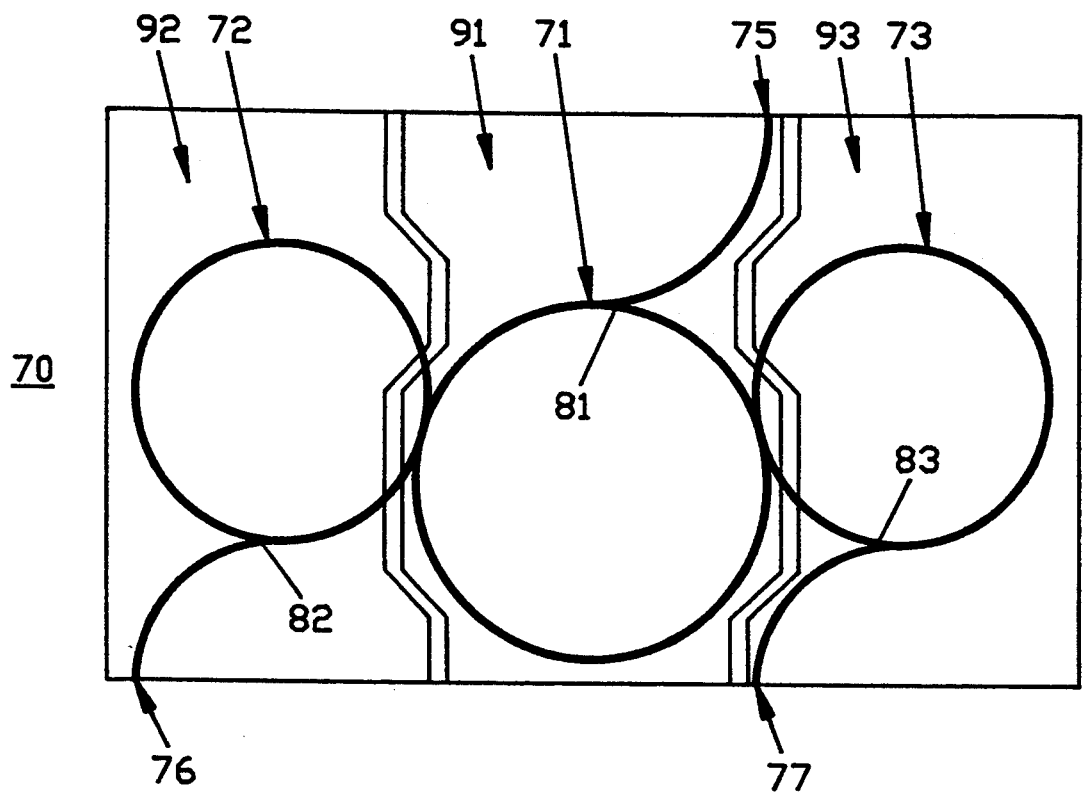
FIG. 5 shows in plan view a three ring cavity device implemented as an active tunable channel-drop filter.

In FIG. 4b, for embodiment #2 the two ring cavities 51 and 52 of the interferometric ring diode laser are separately positioned on the semiconductor substrate. This configuration has advantages for reducing heating effects in the device. With the two ring cavities occupying a larger area of the substrate, the heating in the rib waveguides is reduced, improving device characteristics. This configuration allows a wider range of radii for the two ring cavities (the radius of the non-output-coupled ring cavity may now be made larger or more nearly equal to that of the output-coupled ring cavity). There may be advantages in this design for improved single-frequency performance since the radii of the two ring cavities can be made more nearly equal to increase the period of the modulation of the emission spectrum in the equation above. The separate positioning of the two ring cavities in FIG. 4b will also improve device performance by relaxing the processing tolerances for electrical isolation and will allow additional output Y-junctions to be placed on the other ring of the device for external inputs and outputs. One advantage of this embodiment of the invention is the possibility of using these interferometric ring diode lasers to form active channel-drop filters as shown in FIG. 5. Additional advantages will become evident to those skilled in the art.

Figure 4C:
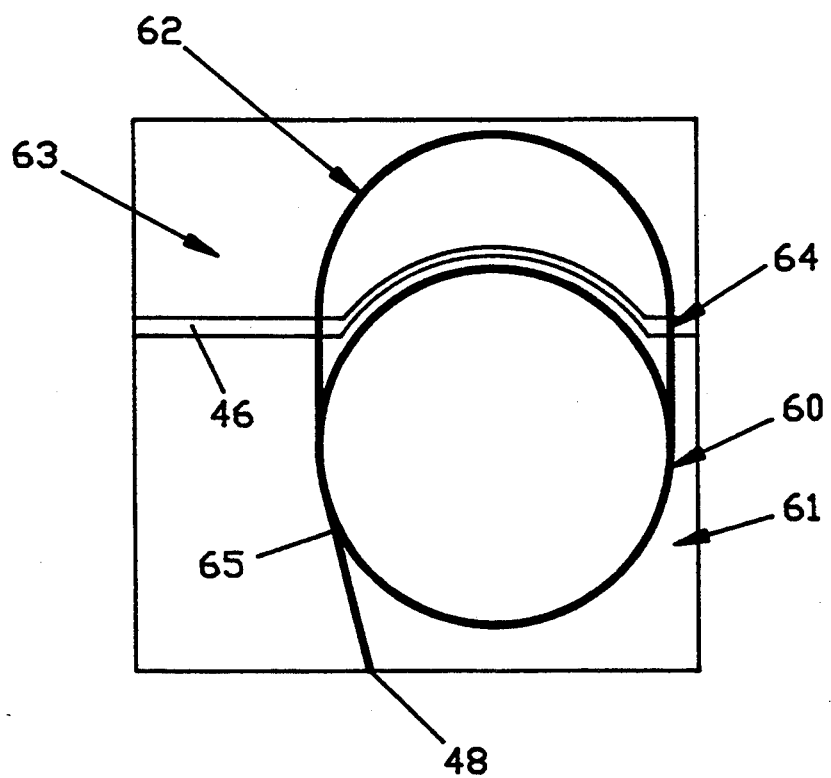

In FIG. 4c, for embodiment #3 the two ring cavities 60 and 62 of the interferometric ring diode laser are made with the same radii to equalize the curved waveguide bend loss. In embodiment #3, the pathlength difference between the two ring cavities is controlled by the length of straight waveguide sections 64 on either side of the device. This allows a freedom to control and vary the pathlength to control the period of modulation of the emission spectrum while maintaining a fixed bend loss characteristic in the curved waveguide sections. In embodiment #3, the output Y-junction 65 is positioned so as to couple out lasing light from both ring cavities which may be advantageous for certain applications. Alternately, one or more output Y-junctions may be located on the curved waveguide sections of one or both ring cavities so as to couple out the lasing light from the two ring cavities separately.

Additional embodiments of the interferometric ring diode laser (including embodiments based on square, triangular, and other polygon ring cavities) will become evident to those skilled in the art, and additional types of output couplers (other than branching waveguide Y-junctions) can be used. These output couplers include but are not limited to partially reflecting mirrors and diffraction gratings.

In FIG. 5, a third ring cavity is added to the interferometric ring diode laser to form a channel-drop filter 70 for separating or combining two different lasing frequencies. This channel-drop filter can be operated below the threshold for lasing as an active waveguide device (with reduced waveguide loss or even gain) or above threshold as an injected laser device. Although, channel-drop filters have been proposed in the past, these devices were large (centimeter size) passive and lossy; and they were in the form of a single waveguide ring cavity with input and output waveguides evanescently coupled to the ring cavity. In addition, they could not be electrically tuned as our invention. Our invention, with active semiconductor ring diode lasers is an improvement over these passive devices in greatly reduced size (150-$\mu$m radius), in being an active device with gain to restore and amplify signal levels, in being electrically tunable to control and vary the channels which are separated or combined, and in having a high Q which will allow a much closer channel spacing.

Each of the ring cavities 71, 72, and 73 in this embodiment of the invention has a separate branching waveguide Y-junction 81, 82 and 83 for input 75 and output 76 and 77 coupling. The direction of the branching waveguide Y-junctions in FIG. 5 is oriented such that the input 75 is coupled to one or the other or both of the outputs 76 and 77 depending on the resonance conditions of the coupled cavities 71 and 72 and also 71 and 73. The device design is reciprocal so that output 1 and output 2, 76 and 77, can be used as inputs for the purpose of combining or multiplexing two signals onto a single waveguide 75. The separate electrical metallizations 91, 92, and 93 to the three ring cavities allow independent electrical tuning of the coupled-cavity resonance frequencies to allow selection of appropriate channel wavelengths.

To use this active channel-drop filter to separate two optical light signals which were elsewhere multiplexed for transmission or signal processing purposes, the multiplexed signal ($\lambda_1 + \lambda_2$) is injected into the center ring which is operated at a bias current level to amplify the signals (the signals can also injection lock the central ring laser). The separate electrical contacts to the two outer ring cavities allow these cavities to be independently tuned in frequency with respect to the central cavity so that the two propagating signal components ($\lambda_1 + \lambda_2$) are independently separated with each directed to a different outer ring cavity. (These two signals may also be separated from a much larger number of mulitplexed signals by the ability to electrically tune the bandpass of the filter and because of the high Q of these active or lasing ring cavities.) The two propagating signal components ($\lambda_1 + \lambda_2$) exit the outer ring Y-junctions separately and are coupled to other waveguides in a photonic integrated circuit or to optical fibers or to other light directing components (e.g. lenses) or detectors for subsequent use and processing.

To combine two separate light signals ($\lambda_1 + \lambda_2$), the process is reversed with the separate signals directed into the outer ring cavities and the multiplexed signal ($\lambda_1 + \lambda_2$) exiting the central ring cavity. Additional ring cavities could be added in the form of an integrated optic circuit to increase the number of channels in this channel-drop filter and for the other applications discussed above. Additional applications and embodiments of multiple-ring cavity interferometric waveguide devices and diode lasers will become evident to those skilled in the art.

We claim:

1. An interferometric ring cavity optical waveguide apparatus comprising first and second ring cavities which are optically coupled for a portion of their lengths, means to provide input light into the first and second ring cavities, and means to transmit light out of the apparatus, wherein at least one of the ring cavities comprises lasing means.

2. An interferometric ring cavity optical waveguide apparatus comprising first and second ring cavities which are optically coupled for a portion of their lengths, means to provide input light into the first and second ring cavities, and means to transmit light out of the apparatus, wherein at least one of the ring cavities comprises a semiconductor active gain material.

3. The apparatus of claim 2 wherein each of the ring cavities with semiconductor active gain material is connected by separate electrical contact means with means to drive that gain material.

4. The apparatus of claim 3 wherein at least one of the ring cavities is provided with means to input light.

5. The apparatus of claim 3 wherein the output means comprises a semiconductor active gain material that is electrically connected to means to vary the gain or loss of the material to modulate the amplitude of the output light.

6. An interferometric ring cavity waveguide apparatus comprising first and second ring cavities, at least one of which comprises laser diode means, which are optically coupled for a portion of their lengths and formed on a substrate and light output means coupled to one of the ring cavities.

7. The apparatus of claim 6 wherein the light output means comprises an active gain semiconductor material.

8. The apparatus of claim 6 wherein the two cavities and the output means each have separate electrode means.

9. The apparatus of claim 6 wherein the first and second cavities and the output means comprise diode laser means.

10. The apparatus of claim 9 wherein the diode laser means in the first and second cavities and in the output means all share a common electrode of one polarity and each of the three has a separate electrode for the other polarity.

11. The apparatus of claim 9 wherein the output face of the output means is not perpendicular to the axis of the output means.

12. The apparatus of claim 9 wherein the apparatus further comprises photodetector means optically connected to the output means.

13. The apparatus of claim 12 wherein the apparatus further comprises feedback means responsive to the electrical output of the photodetector means, which includes means to control the current injected into the diode laser means.

14. The apparatus of claim 13 wherein the feedback means includes means to maintain the optical power from the output means at its peak level within the normal operating range of the apparatus.

15. The apparatus of claim 13 wherein the apparatus further includes a logic current input line connected to one of the ring cavities and to the feedback means such that the feedback means includes:

first means to hold the output power of the apparatus at a first power level which is sufficiently lower than the peak power level to establish a different logic state than that represented by the peak power level by controlling the injected current level at a first current level which is less than that necessary to produce the peak power in the absence of any added current from the logic current input line and second means to hold the injected current level at a second level sufficient to produce peak power when the sum of the first current level and the logic current level equals this second level.

16. The apparatus of claim 15 wherein the apparatus further includes third means to hold the output power at a third power level equivalent to the first power level when the sum of the injected current at the first current level and the logic current is sufficient to produce this third level.

17. The apparatus of claim 9 wherein the apparatus further comprises a third ring cavity comprising a laser diode material optically coupled to the first cavity, an optical input line to the first cavity, the light output means being connected to the second cavity, and an additional light output means being connected to the third ring cavity, thereby forming a channel-drop filter means.

18. The apparatus of claim 10 wherein at least one of the separate electrodes is connected to means to modulate the signal to that electrode such that the light output is modulated with respect to amplitude, wavelength or phase.

* * * * *